(12) United States Patent
Hahn

(10) Patent No.: US 6,958,299 B2
(45) Date of Patent: Oct. 25, 2005

(54) METHODS OF MANUFACTURING SEMICONDUCTOR DEVICES

(75) Inventor: Seung Ho Hahn, Yongin-Si (KR)

(73) Assignee: DongbuAnam Semiconductor, Inc., Seoul (KR)

( * ) Notice: Subject to any disclaimer, the term of this patent is extended or adjusted under 35 U.S.C. 154(b) by 0 days.

(21) Appl. No.: 10/726,871

(22) Filed: Dec. 3, 2003

(65) Prior Publication Data

US 2004/0127006 A1 Jul. 1, 2004

(30) Foreign Application Priority Data

Dec. 30, 2002 (KR) ................................. 10-2002-0086922

(51) Int. Cl.[7] ........................ H01L 21/31; H01L 21/469
(52) U.S. Cl. ........................ 438/766; 438/770; 438/775
(58) Field of Search ................................. 438/585, 769, 438/770, 775, 766, 914

(56) References Cited

U.S. PATENT DOCUMENTS

| | | | |
|---|---|---|---|
| 4,503,601 A | * | 3/1985 | Chiao .......................... 438/303 |
| 5,648,287 A | * | 7/1997 | Tsai et al. .................... 438/305 |
| 5,872,376 A | | 2/1999 | Gardner et al. .............. 257/336 |
| 6,365,516 B1 | * | 4/2002 | Frenkel et al. ............... 438/682 |
| 6,486,039 B2 | * | 11/2002 | Yoo et al. .................... 438/425 |

* cited by examiner

Primary Examiner—Jennifer M. Kennedy
(74) Attorney, Agent, or Firm—Hanley, Flight & Zimmerman, LLC

(57) ABSTRACT

A method for manufacturing a semiconductor device is disclosed. One example manufacturing method includes successively depositing gate insulating layer forming material and gate electrode forming material on a semiconductor substrate and patterning the gate insulating layer forming material and the gate electrode forming material to form a gate insulating layer and a gate electrode. The example manufacturing method further includes performing a nitrogen ion-implantation to a front face of the substrate and annealing the substrate so as to form a re-oxidation layer that has different thickness on the sidewalls of the gate electrode and on the substrate. The example method results in semiconductor gate electrodes and sidewalls having different oxidation rates so that a thickness of the re-oxidation layer of the sidewalls of the gate electrode is relatively thickened.

14 Claims, 6 Drawing Sheets

METHODS OF MANUFACTURING SEMICONDUCTOR DEVICES

TECHNICAL FIELD

The present disclosure relates to semiconductor fabrication and, more particularly, to methods of manufacturing semiconductor devices.

BACKGROUND

Generally, semiconductor manufacturing processes have used technology having a sub-micron unit of precision to obtain semiconductor devices having excellent operational performance and a high level of integration. A reduced size of the semiconductor device may be accomplished by reducing horizontal and vertical dimensions of the device, thereby providing a balanced characteristic of the semiconductor device. If the dimensions of the semiconductor device are reduced without considering this fact, a length of the channel between a source and a drain is shortened to provide an undesired characteristic change of the semiconductor device. The representative characteristic change is a short channel effect.

To solve the short channel effect, it would be necessary to perform a horizontal reduction such as a length reduction of a gate electrode and a vertical reduction as well, such as the reductions of a thickness of a gate insulating layer and a depth of a junction of source/drain. Also, it would also require a reduction of power voltage applied, an increase of doping concentration of a semiconductor substrate, and an effective control of doping profile of a channel region, particularly.

However, because operational power required by electronics goods is not yet lowered (although the dimension of the semiconductor device is reduced), in case of, for example, NMOS transistor, it has a defective structure that may cause a hot carrier situation in which electrons from the source are considerably accelerated due to high potential gradient of the drain. Thus, a Lightly Doped Drain (LDD) has been proposed to improve NMOS transistor suffering from hot carrier effects. LDD transistor is constructed so that a lightly doped (n−) region thereof is positioned between a channel and a heavily doped (n+) drain/source. The lightly doped (n−) region serves to buffer high drain voltage around the drain junction so as not to cause a rapid change of electric potential, which restricts hot carriers. While a manufacturing method for high-integrated semiconductor device has been studied, various technologies for manufacturing an LDD structured Metal Oxide Semiconductor Field Effect Transistor (MOSFET) have been proposed. Among them, a method for manufacturing an LDD in which a spacer is formed on a sidewall of a gate electrode is a typical method. The method has been widely adapted to a technology for mass production to date. Also, in order to complement technical problems of the manufacturing method for LDD, U.S. Pat. No. 5,872,376 has proposed a method for manufacturing LDD in which a thin film of silicon layer is deposited on a buffer oxide layer so as to prevent a degradation of electric property of LDD structure.

A conventional method for manufacturing a semiconductor device will be now explained. As shown in FIG. 1, an isolation layer 102 is formed on a field region of a semiconductor substrate 101 in order to electrically insulate between, for example, active regions of the first conductive-p type semiconductor substrate 101 using a shallow trench isolation (STI) process. A gate insulating layer 103, for example, an oxide layer is grown on the active region by a thermal-oxidation process.

Then, a poly-crystal silicon layer for a gate electrode 104 is deposited on the gate insulating layer 103 by a low pressure chemical vapor deposition (CVD) process. Patterns of gate electrode 104 are formed as to be spaced apart with a predetermined distance using a photolithography. Of course, the gate electrode 104 can be composed of single layered poly silicon layer or of poly silicon layer and a silicide layer thereon.

Then, second conductive impurities such as P are ion-implanted to be lightly doped (n−) on the semiconductor substrate 101 in the active region in order to form a lightly doped (n−) region for LDD structure. Herein, the gate electrode 104 is also ion-implanted as to be lightly doped (n−) with impurities such as P.

As shown in FIG. 2, when the gate electrode 104 has been formed, a certain thermal oxidation process is performed to recover a damaged gate insulating layer due to a dry-etching of the gate electrode. Then, an oxide layer 105 for a spacer 107 of FIG. 4 is deposited in a thin thickness of about 200 Å on the gate insulating layer 103. Herein, the oxide layer 105 is formed by O3-Tetra-Ethyl-Ortho-Silicate (TEOS) CVD process or Plasma CVD process. Then, a nitride layer 106 for spacer 107 is deposited in a thickness of 800 to 1000 Å on the oxide layer 105 by low pressure CVD process.

As shown in FIG. 3, when the nitride layer 106 has been formed, using a Reactive Ion Etching (RIE) process with anisotropic etching property as an etch back process, the nitride layer 106 is dry-etched until the oxide layer 105 on the semiconductor substrate 101 in the region for source/drain and the gate electrode 104 is exposed. Herein, the nitride layer 106 remains still on the sidewalls thereof.

As shown in FIG. 4, the oxide layer 105 is dry-etched by dry etching process until the semiconductor substrate 101 in the region for source/drain and the gate electrode 104 are exposed. Thus, the oxide layer 105 remains on the sidewalls of the gate electrode 104 masked by the nitride layer 106. Accordingly, a spacer 107 consisting of the nitride layer 106 and the oxide layer 105 is formed.

Then, second conductive impurities such as P are ion-implanted to be heavily doped (n+) on the semiconductor substrate 101 in the active region that is not masked by the spacer 107 in order to form a heavily doped (n+) source/drain. Herein, the gate electrode 104 is also ion-implanted to be heavily doped (n+) with impurities such as P. Accordingly, LDD structure source/drain (not shown) is formed around the gate electrode 104 of the semiconductor substrate 101.

However, in the conventional method for manufacturing a semiconductor device, in order to recover a damaged gate insulating layer after the patterning of the gate electrode, certain thermal oxidation process is performed so that a certain oxide layer is formed on the sidewalls of the gate electrode and on the substrate. Herein, considering a recovery of the damaged gate insulating layer, the thicker the oxide layer on the sidewalls of the gate electrode is, the better the effect thereof is. On the contrary, considering an aim for minimizing substrate damage due to subsequent ion implantation, the thinner the oxide layer on the substrate is, the better the effect thereof is.

As described above, there are conflicting reasons to control thickness of the oxide layer on the substrate and on the sidewalls of the gate electrode. In the conventional method, the thickness control has been performed in consideration of correlation between the two cases.

However, in the conventional method, besides two factors for determination of the thickness of the oxide layer, an implementation of a photolithography for control of line width of a gate is not considered as another important factor. That is to say, in order to secure process margin in the subsequent control of line width of the gate, it is advantageous that the oxide layer on the sidewalls of the gate electrode is thicker, which should be considered upon forming an oxide layer by re-oxidation process.

DETAILED DESCRIPTION

Figure 1:
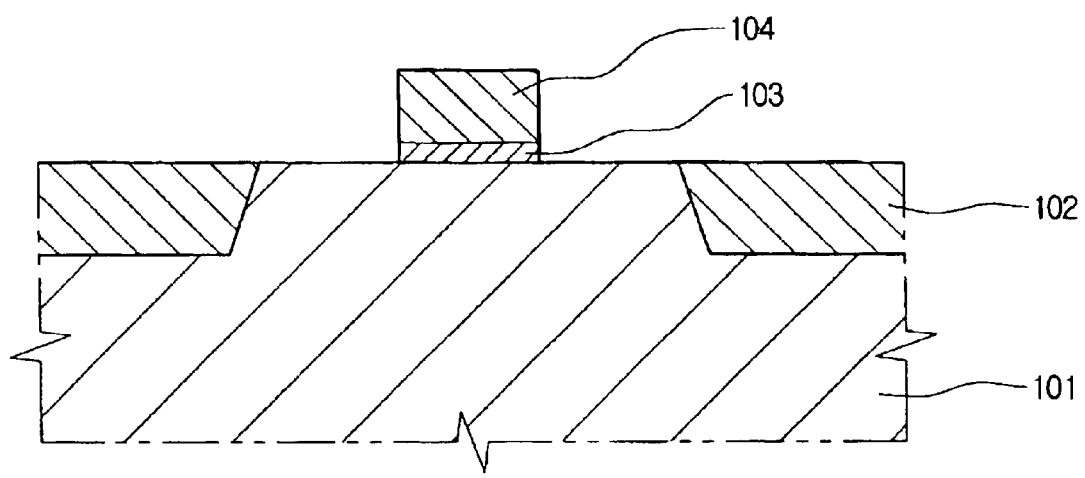
FIGS. 1 to 4 are cross-sectional views for explaining a known method for manufacturing semiconductor devices.
Figure 2:
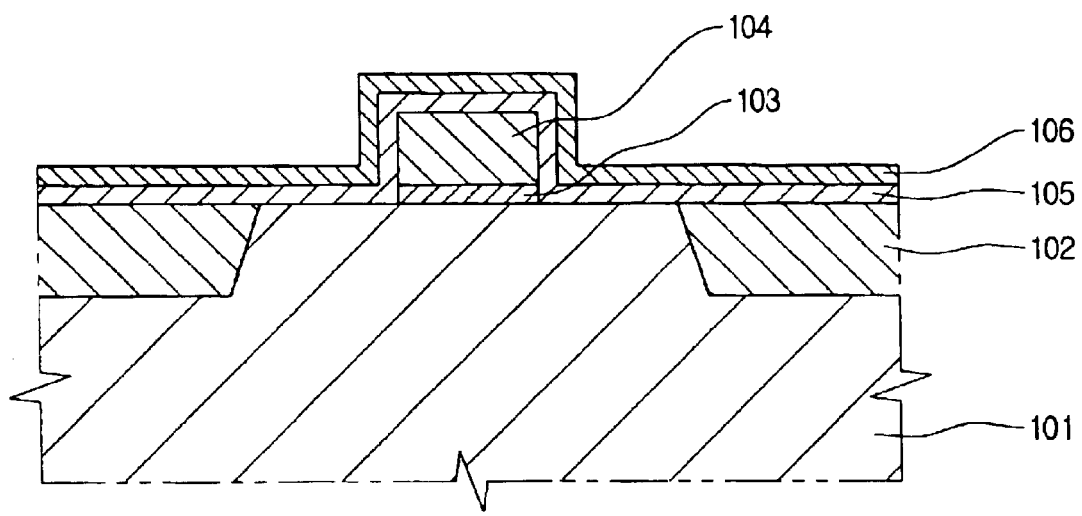
Figure 3:
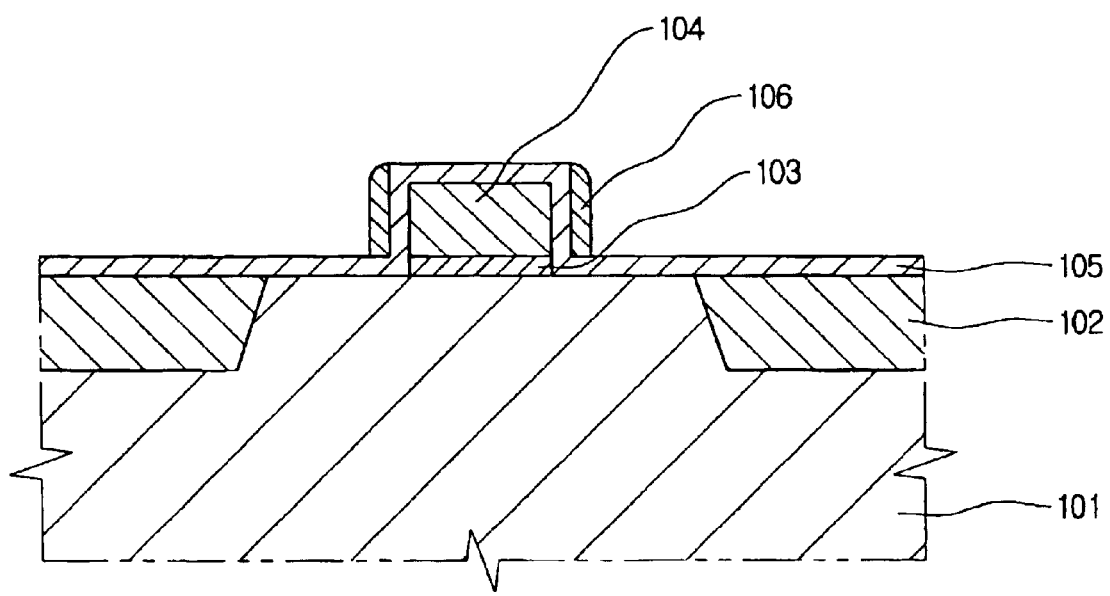
Figure 4:
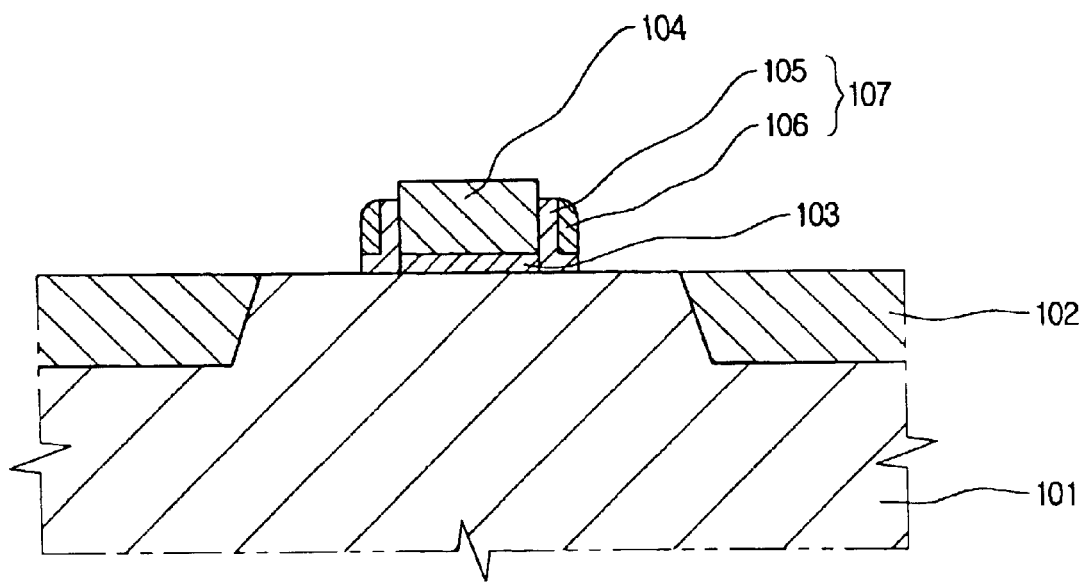

Hereinafter, example methods of semiconductor fabrication are described with reference to the accompanying drawings. In the following description and drawings, like reference numerals are used to designate the same or similar components, and so repetition of the description of the same or similar components will be omitted.

Figure 5:
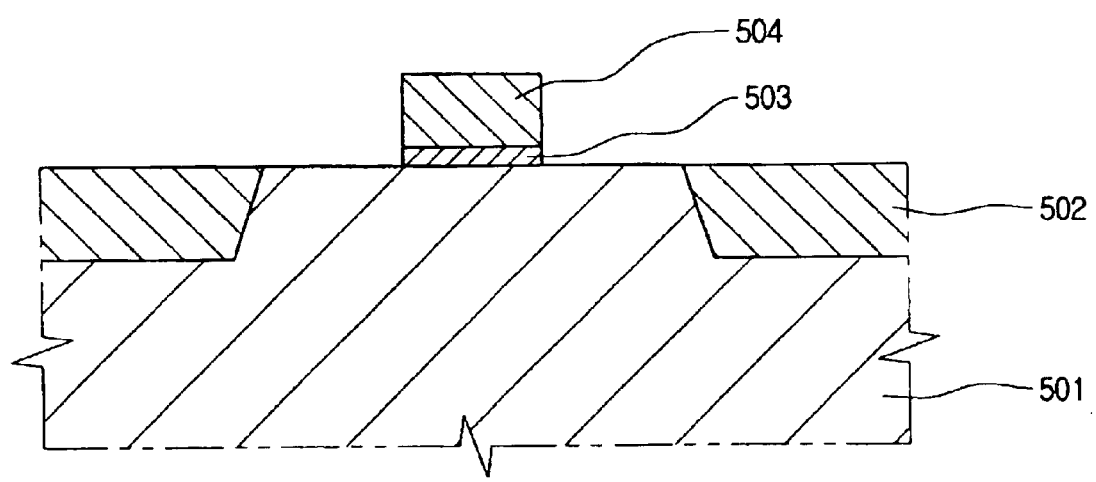
FIGS. 5 to 7 are cross-sectional views for explaining the disclosed methods for manufacturing semiconductor devices.

Turning now to in FIG. 5, an example method for fabricating a semiconductor device begins when an isolation layer 502 is formed on a field region of a semiconductor substrate 501. The isolation layer 502 electrically insulates, for example, active regions of semiconductor substrate 501, which may be implemented using a conductive p-type semiconductor substrate, using a shallow trench isolation (STI) process. Alternatively, the isolation layer 502 may be formed on the semiconductor substrate 501 by a Local Oxidation of Silicon (LOCOS) process rather than an STI process. A gate insulating layer 503 such as, for example, an oxide layer is then grown on the active region of the semiconductor substrate 501 by a thermal-oxidation process.

After the gate insulating layer 503 and the isolation layer 502 have been formed, a poly-crystal silicon layer is deposited on the gate insulating layer 503 to form a gate electrode 504. The gate electrode 504 may be deposited by a low pressure chemical vapor deposition (CVD) process. Patterns of gate electrode 504 are formed as to be spaced apart with a predetermined distance using a photolithography. Of course, the gate electrode 504 can be implemented using a single layered poly silicon layer or may be implemented using a poly silicon layer having a silicide layer disposed thereon.

Figure 6:
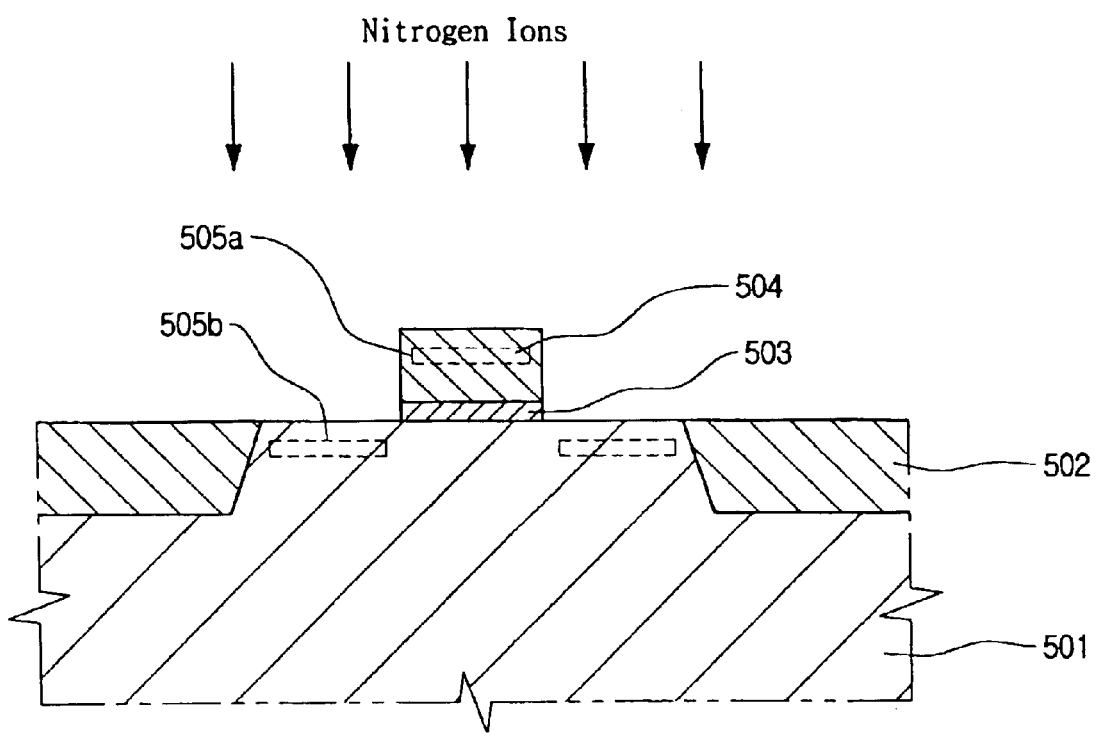

As shown in FIG. 6, in a state where the gate electrode 504 has been patterned, an implantation process of nitrogen ions such as N+ or N2+ ions is performed on the front face of the substrate including the gate electrode 504. According to one example, —an angle of nitrogen ion implantation may be vertical to the substrate and the energy of nitrogen ion implantation may be 10 to 50 kiloelectron volts (keV). According to this example, the dose of nitrogen ion implantation is $10^{14}$ to $5 \times 10^{15}$ atoms/cm$^2$__Nitrogen ions serve to restrict growing rate of an oxide layer upon performing re-oxidation process successively.

Figure 7:
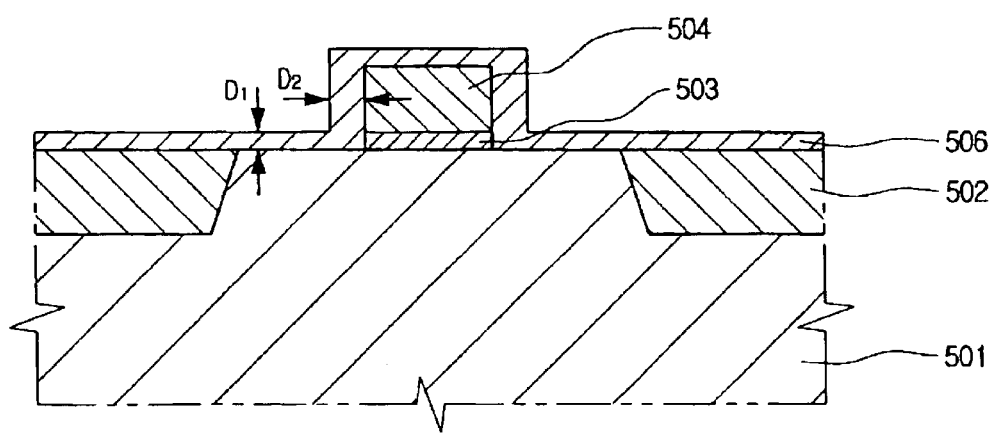

Referring to FIG. 7, after the nitrogen ions have been implanted to the front face of the substrate, an annealing process for forming re-oxidation layer 506 is performed to the whole substrate 501. The annealing process may use an annealing temperature that may be a conventional annealing temperature such as, for example, 800 to 1000° C. Also, of course, the temperature and time for the annealing process are selectively controlled according to a desired thickness of the re-oxidation layer 506.

Meanwhile, because nitrogen ions have been included in the substrate by nitrogen ion implantation, an oxidation rate at which the re-oxidation layer 506 thickness grows is reduced because the annealing process is slowed. On the other hand, nitrogen ions 505a implanted to the gate electrode 504 are concentrated on upper portion of the gate electrode 504 so that they hardly influence the growth of the re-oxidation layer 506 on the sidewalls of the gate electrode 504. Accordingly, the thickness of re-oxidation layer 506 on the sidewalls of the gate electrode 504 becomes larger than that of re-oxidation layer on the semiconductor substrate 501. That is to say, for the same temperature and time for an annealing process, the thicknesses (D1, D2) of the re-oxidation layers 506 on the sidewalls of the gate electrode 504 and on the semiconductor substrate 501 are different.

Thus, using the disclosed techniques, a minimum thickness of the re-oxidation layer 506 that minimizes damage of the semiconductor substrate 501 due to subsequent ion implantation can be obtained. Additionally, considering another aspect of the formation of the proper thickness of the re-oxidation layer 506 on the sidewalls of the gate electrode 504, the thickening of the re-oxidation layer 506 on the sidewalls provides process margin in photolithography for control of the line width of the gate and for recovering the damaged gate insulating layer caused by the patterning of the gate electrode 504 by dry-etching. That is, the thicknesses of the re-oxidation layer 506 on the substrate and on the sidewalls of the gate electrode 504 are formed differently, thereby minimizing substrate damage upon subsequent ion implantation, and further securing process margin for control of the line width of the gate, and effectively performing recovery of the damaged gate insulating layer as well.

Further, strictly speaking, the re-oxidation layer 506 formed on the semiconductor substrate 501 by the annealing process has a property of nitrified oxide layer because nitrogen components are implanted in the substrate by nitrogen ion implantation process prior to annealing. Because the re-oxidation layer on the substrate is characterized as a property of nitrified oxide layer, when LDD ions or source/drain ions subsequently implanted in the substrate are diffused by certain annealing processes, the generation of interstitial silicon atoms assisting the diffusion is minimized, thus restricting diffusion of LDD ions or source/drain ions to unnecessary regions.

After the foregoing processing, the resulting semiconductor device may be completed by performing other processes thereon. For example, further processing may include processing to form a gate, an LDD ion implantation process for ion-implanting the second conductive impurities such as P on the semiconductor substrate in the active region to form a lightly doped (n−) region for LDD structure, and a forming process of a spacer with certain thickness on the sidewalls of the gate.

The disclosed manufacturing methods may be advantageously incorporated into conventional semiconductor manufacturing process by adding the nitrogen ion implantation process before formation of the re-oxidation layer 506.

As described above, the disclosed methods of manufacturing semiconductor devices have the following effects. Conventionally, the re-oxidation process for recovery of the damaged substrate and gate insulating layer is performed after the patterning of the gate electrode. However, as disclosed herein, before the re-oxidation process, nitrogen ions are implanted on the front face of the substrate with certain doping concentration, so that the thicknesses of the re-oxidation layer on the sidewalls of the gate electrode and on the substrate upon subsequent annealing process for forming the re-oxidation layer can be formed differently. Accordingly, two goals are simultaneously achieved, i.e., a thickening of the re-oxidation layer on the sidewalls of the gate electrode for recovering the damaged gate insulating layer of the prior art, and a thinning of the re-oxidation layer on the substrate for preventing the substrate from being damaged by subsequent ion implantation, and further effect of sufficiently providing process margin upon a photolithography for control of the line width of the gate.

According to one disclosed example, a method for manufacturing a semiconductor device includes successively depositing gate insulating layer forming material and gate electrode forming material on a semiconductor substrate and patterning the gate insulating layer-forming material and the gate electrode forming material to form a gate insulating layer and a gate electrode. The example method further includes performing nitrogen ion-implantation to a front face of the substrate and annealing the substrate so as to form a re-oxidation layer that has different thickness on the sidewalls of the gate electrode and on the substrate. The foregoing example process yields a semiconductor device in which oxidation rates of sidewalls of the gate electrode and a silicon substrate are differentiated with each other so that a thickness of an oxide layer of the sidewalls of the gate electrode is relatively thickened, thus providing a photolithography for forming a gate with a process margin, increasing a recovery effect of a gate insulating layer through the re-oxidation, and restricting a diffusion of dopants through an induction of partial nitrification to an oxide layer for subsequent ion implantation.

Although certain methods performed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for manufacturing a semiconductor device, the method comprising:
   successively depositing gate insulating layer forming material and gate electrode forming material on a semiconductor substrate;
   patterning the gate insulating layer forming material and the gate electrode forming material to form a gate insulating layer and a gate electrode;
   performing a nitrogen ion-implantation to the substrate and the gate electrode after the forming of the gate insulating layer and the gate electrode;
   annealing the substrate so as to form a re-oxidation layer that has different thickness on the sidewalls of the gate electrode than on the substrate; and
   forming source/drain regions after the annealing of the substrate.

2. A method for manufacturing a semiconductor device as claimed in claim 1, wherein the nitrogen ion implantation is performed at an energy of 10 to 50 keV.

3. A method for manufacturing a semiconductor device as claimed in claim 1, wherein dose of nitrogen ion implantation is $10^{14}$ to $5\times10^{15}$ atoms/cm$^2$.

4. A method for manufacturing a semiconductor device as claimed in claim 1, wherein an angle of nitrogen ion implantation is vertical to the substrate.

5. A method for manufacturing a semiconductor device as claimed in claim 4, wherein the nitrogen ion implantation is performed at an energy of 10 to 50 keV.

6. A method for manufacturing a semiconductor device as claimed in claim 4, wherein dose of nitrogen ion implantation is $10^{14}$ to $5\times10^{15}$ atoms/cm$^2$.

7. A method for manufacturing a semiconductor device as claimed in claim 1, wherein the re-oxidation layer on the substrate is thinner than the re-oxidation layer on the sidewalls of the gate electrode.

8. A method for manufacturing a semiconductor device, the method comprising:
   successively depositing gate insulating layer forming material and gate electrode forming material on a semiconductor substrate;
   patterning the gate insulating layer forming material and the gate electrode forming material to form a gate insulating layer and a gate electrode;
   performing a nitrogen ion-implantation to the substrate and the gate electrode after the forming of the gate insulating layer and the gate electrode;
   annealing the substrate so as to form a re-oxidation layer that has different thickness on the sidewalls of the gate electrode than on the substrate; and
   forming an LDD structure after the annealing the substrate.

9. The method for manufacturing a semiconductor device as claimed in claim 8, wherein the nitrogen ion-implantation is performed at an energy of 10 to 50 keV.

10. The method for manufacturing a semiconductor device as claimed in claim 8, wherein dose of nitrogen ion implantation is $10^{14}$ to $5\times10^{15}$ atoms/cm$^2$.

11. A method for manufacturing a semiconductor device as claimed in claim 8, wherein an angle of nitrogen ion implantation is vertical to the substrate.

12. A method for manufacturing a semiconductor device as claimed in claim 11, wherein the nitrogen ion-implantation is performed at an energy of 10 to 50 keV.

13. A method for manufacturing a semiconductor device as claimed in claim 11, wherein dose of nitrogen ion implantation is $10^{14}$ to $5\times10^{15}$ atoms/cm$^2$.

14. A method for manufacturing a semiconductor device as claimed in claim 8, wherein the re-oxidation layer on the substrate is thinner than the re-oxidation layer on the sidewalls of the gate electrode.

* * * * *